United States Patent
Hatada

(10) Patent No.: US 9,812,497 B2
(45) Date of Patent: Nov. 7, 2017

(54) METHOD FOR MANUFACTURING MAGNETIC STORAGE DEVICE, AND MAGNETIC STORAGE DEVICE

(75) Inventor: Akiyoshi Hatada, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 802 days.

(21) Appl. No.: 13/070,714

(22) Filed: Mar. 24, 2011

(65) Prior Publication Data

US 2011/0272770 A1 Nov. 10, 2011

(30) Foreign Application Priority Data

May 7, 2010 (JP) .................. 2010-107187

(51) Int. Cl.
*H01L 27/22* (2006.01)
*H01L 43/12* (2006.01)

(52) U.S. Cl.
CPC ............ *H01L 27/228* (2013.01); *H01L 43/12* (2013.01)

(58) Field of Classification Search
CPC ............................. H01L 43/12; H01L 27/228
USPC ............... 257/421, E21.665, E29.323; 438/3
See application file for complete search history.

(56) References Cited

U.S. PATENT DOCUMENTS

| | | | |
|---|---|---|---|
| 6,153,443 A | 11/2000 | Durlam et al. | |
| 9,166,155 B2 * | 10/2015 | Deshpande | ............ H01L 43/12 |
| 2006/0138576 A1 | 6/2006 | Galdis | |

FOREIGN PATENT DOCUMENTS

| | | | |
|---|---|---|---|
| JP | 2001-168418 A | 6/2001 | |
| JP | 2001-284679 A | 10/2001 | |
| JP | 2002-299724 A | 10/2002 | |
| JP | 2002-533916 A | 10/2002 | |
| JP | 2003-332650 A | 11/2003 | |
| JP | 2007-521629 A | 8/2007 | |
| JP | 2011238679 A | * | 11/2011 |

OTHER PUBLICATIONS

Japanese Office Action dated Feb. 18, 2014, issued in corresponding Japanese Patent Application No. 2010-107187 with English partial translation (5 pages).

* cited by examiner

*Primary Examiner* — Hrayr A Sayadian
(74) *Attorney, Agent, or Firm* — Westerman, Hattori, Daniels & Adrian, LLP

(57) ABSTRACT

A lower conductive film is formed over a substrate. A first insulating film is formed in the lower conductive film. An opening which reaches the lower conductive film is formed in the first insulating film. An MTJ multilayer film having a magnetization free layer, a tunnel barrier layer and a magnetization fixed layer is deposited over the lower conductive film in the opening and over the first insulating film. An upper electrode is formed over the MTJ multilayer film. By removing the portion of the MTJ multilayer film deposited over the first insulating film, an MTJ device composed of the portion of the MTJ multilayer film which has remained in the opening is formed. A lower electrode composed of the lower conductive film is formed under the MTJ device by removing at least a part of the first insulating film, and a part of the lower conductive film.

8 Claims, 13 Drawing Sheets

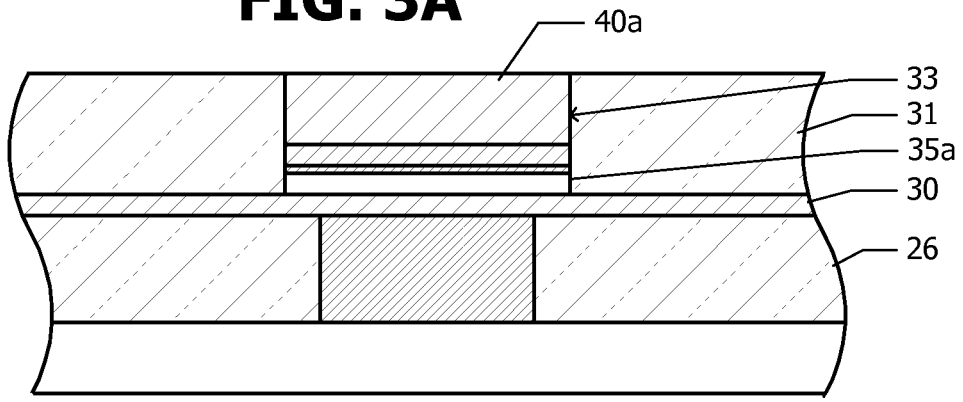
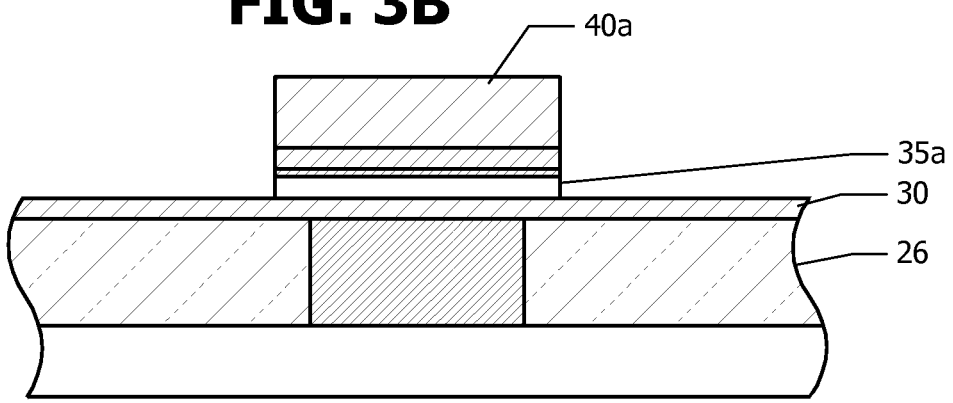
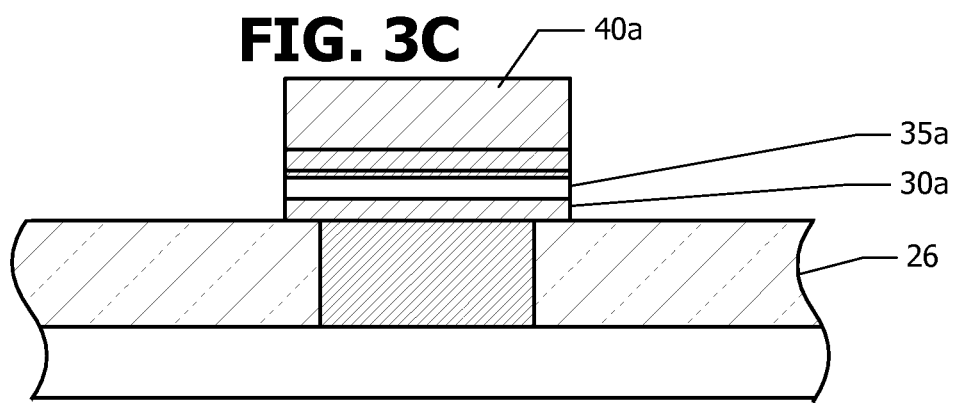

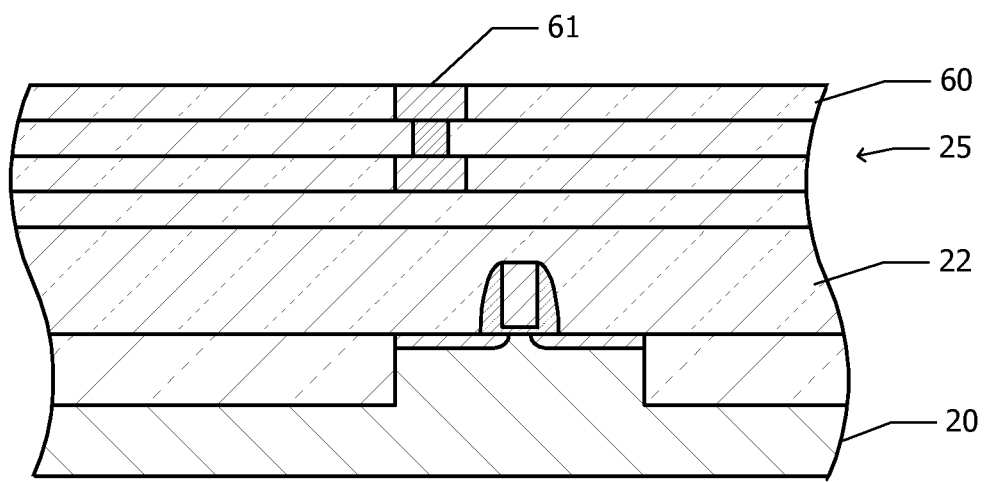
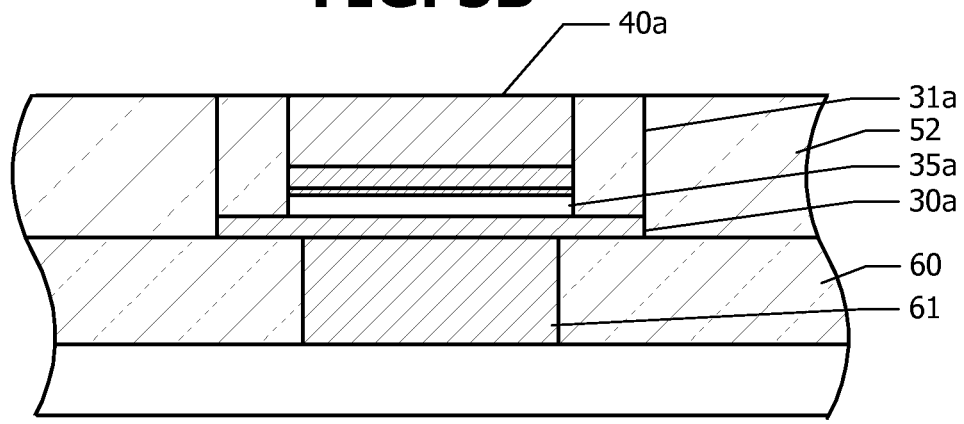

METHOD FOR MANUFACTURING MAGNETIC STORAGE DEVICE, AND MAGNETIC STORAGE DEVICE

CROSS-REFERENCE TO RELATED APPLICATION

This application is based upon and claims the benefit of priority of the prior Japanese Patent Application No. 2010-107187, filed on May 7, 2010, the entire contents of which are incorporated herein by reference.

FIELD

The present invention relates to a method for manufacturing a magnetic storage device including a magnetic tunnel junction (MTJ), and the magnetic storage device.

BACKGROUND

An MTJ is employed in a non-volatile magnetic storage device. As a multilayer film which constitutes the MTJ (hereinafter referred to as MTJ multilayer film) includes transition metals, it has poor reactivity with a usually employed process gas. For this reason, an MTJ multilayer film is processed with a hard mask, and under conditions that strong physical sputtering can be performed. When processing is performed under such conditions, a marked shoulder drop occurs in the hard mask, resulting in inclination of the side surfaces of the patterned MTJ multilayer film. Because such an inclined surface is formed, it becomes difficult to micronize an area occupied by an MTJ device. In addition, the inclined side surfaces are susceptible to damage caused by plasma.

When etching an MTJ multilayer film, a product generated during the etching is likely to adhere to the side surfaces of the MTJ multilayer film. The product adhered to the side surfaces may cause an increase in leakage current. In the case where an ashing treatment is introduced to remove the adhered product, a tunnel barrier layer of the MTJ multilayer film is oxidized, and the thickness thereof is increased. Therefore, it is difficult to introduce an ashing treatment.

By depositing an MTJ multilayer film in a recess formed in an interlayer insulating film, it is possible to refrain from the use of shaping by the physical sputtering.

Japanese Unexamined Patent Application Publication Nos. 2001-284679 and 2002-299724 are examples of related art.

SUMMARY

Beneath an interlayer insulating film in which a recess is provided, a lower wiring structure is disposed to which an MTJ device is connected. When forming the recess, proper alignment of the lower wiring structure to the recess must be achieved. As a planar size of the recess is microscopic (for example, about 0.1 μm in a diameter), it is difficult to achieve the alignment.

According to an aspect of the invention, a method for manufacturing a magnetic storage device includes:
forming a lower conductive film over a substrate;
forming a first insulating film over the lower conductive film;
forming an opening which reaches the lower conductive film in the first insulating film;
depositing an MTJ multilayer film having a magnetization free layer, a tunnel barrier layer and a magnetization fixed layer over the lower conductive film in the opening and over the first insulating film;
forming an upper electrode over the MTJ multilayer film;
forming, by removing the portion of the MTJ multilayer film deposited over the first insulating film, an MTJ device composed of the portion of the MTJ multilayer film which has remained in the opening; and
forming a lower electrode composed of the lower conductive film under the MTJ device by removing at least a part of the first insulating film, and a part of the lower conductive film.

According to another aspect of the invention, a magnetic storage device includes:
a substrate in which a conductive region is exposed on an insulating surface;
a lower electrode disposed over the substrate in such a way that the lower electrode partially overlaps the conductive region;
an MTJ device disposed over the lower electrode and having a smaller planar shape than the lower electrode;
a first insulating film disposed over a region on a top surface of the lower electrode where the MTJ device is not disposed and having an outer periphery matching an outer periphery of the lower electrode; and
an upper electrode disposed over the MTJ device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A to FIG. 3F are cross-sectional views of a magnetic storage device at an intermediate stage of manufacture in accordance with a method for manufacturing a magnetic storage device of the second embodiment;

FIG. 5A and FIG. 5B are cross-sectional views of a magnetic storage device at an intermediate stage of manufacture in accordance with a method for manufacturing a magnetic storage device of the fourth embodiment;

DESCRIPTION OF EMBODIMENTS

Figure 1A:
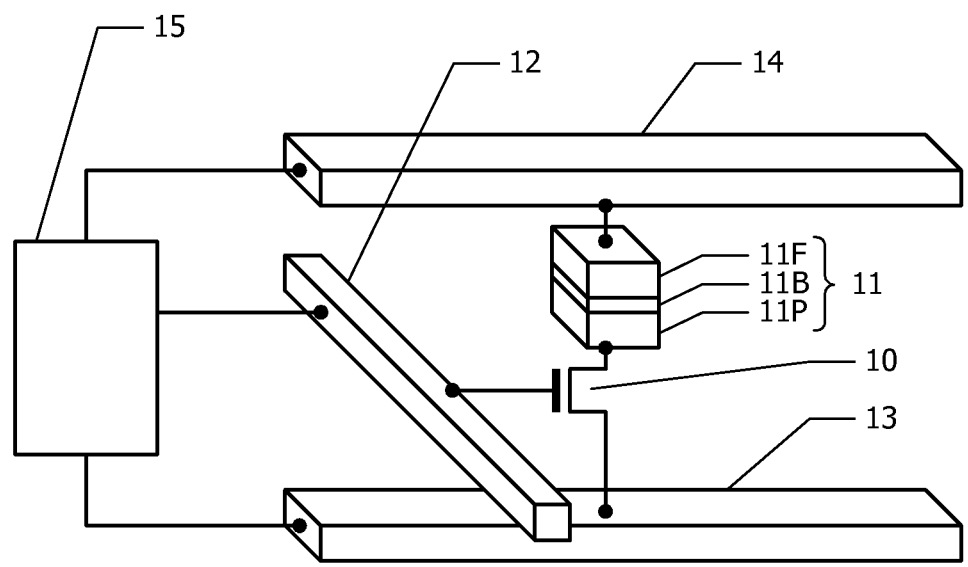
FIG. 1A is a schematic view of a magnetic storage device according to an embodiment.

FIG. 1A illustrates a schematic view of one cell of a spin-injection magnetic storage device of an embodiment. One memory cell includes one transistor 10 and one MTJ device 11. The MTJ device 11 has a laminated structure in which a tunnel barrier layer 11B is sandwiched between a pinned layer 11P and a free layer 11F. A gate electrode of the transistor 10 is connected to a word line 12, and a source is connected to a source line 13. A drain of the transistor 10 is connected to a bit line 14 through the MTJ device 11. A control circuit 15 supplies a write or read signal to the word line 12, the source line 13 and the bit line 14, which correspond to a cell to be written or read.

Figure 1B:
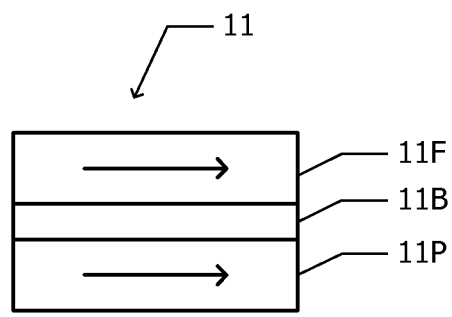
FIG. 1B is a cross-sectional view illustrating a magnetization direction of an MTJ device in a low-resistance state.

FIG. 1B illustrates a magnetization direction of the MTJ device 11 when it is in a low-resistance state. A magnetization direction of the pinned layer 11P and that of the free layer 11F are parallel to each other.

Figure 1C:
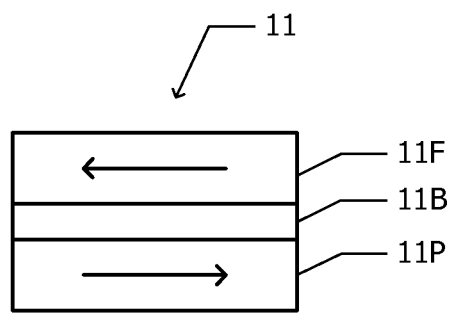
FIG. 1C is a cross-sectional view illustrating a magnetization direction of an MTJ device in a high-resistance state.

FIG. 1C illustrates a magnetization direction of the MTJ device 11 when it is in a high-resistance state. A magnetization direction of the pinned layer 11P and that of the free layer 11F are anti-parallel to each other.

Hereinafter, a writing method is described. In order to make the MTJ device 11 in a low-resistance state, a write current is applied from the bit line 14 to the source line 13. At this time, electrons which are spin-polarized in the same direction as the magnetization direction of the pinned layer 11P are transferred from the pinned layer 11P to the free layer 11F. By the electrons transferred to the free layer 11F, the magnetization direction of the free layer 11F becomes parallel to that of the pinned layer 11P. This makes the MTJ device 11 in a low-resistance state illustrated in FIG. 1B.

In order to make the MTJ device 11 in a high-resistance state, a write current is applied from the source line 13 to the bit line 14. At this time, electrons are transferred from the free layer 11F to the pinned layer 11P. The electrons which are spin-polarized in a direction opposite to the magnetization direction of the pinned layer 11P is reflected and returns to the free layer 11F. By the electrons which have returned to the free layer 11F, the magnetization direction of the free layer 11F becomes anti-parallel to that of the pinned layer 11P. This makes the MTJ device 11 in a high-resistance state illustrated in FIG. 1C.

Next, a reading method is described. A read voltage is applied between the source line 13 and the bit line 14. A current passes through the MTJ device 11 corresponding to the resistance thereof. It is possible to determine whether the MTJ device 11 is in a low-resistance state or in a high-resistance state based on the magnitude of the current. The magnitude of the read current is adjusted not to cause a change in the magnetization direction of the free layer 11F.

Embodiments to be described below are applicable not only to 1Tr-1MTJ memory cells illustrated in FIG. 1A but also to 1Tr-2MTJ memory cells. Further, the embodiments are applicable not only to spin-injection magnetic storage devices but also to magnetic field writing magnetic storage devices.

First Embodiment

A method for manufacturing a magnetic storage device according to the first embodiment is described with reference to FIG. 2A to FIG. 2K.

Figure 2A:
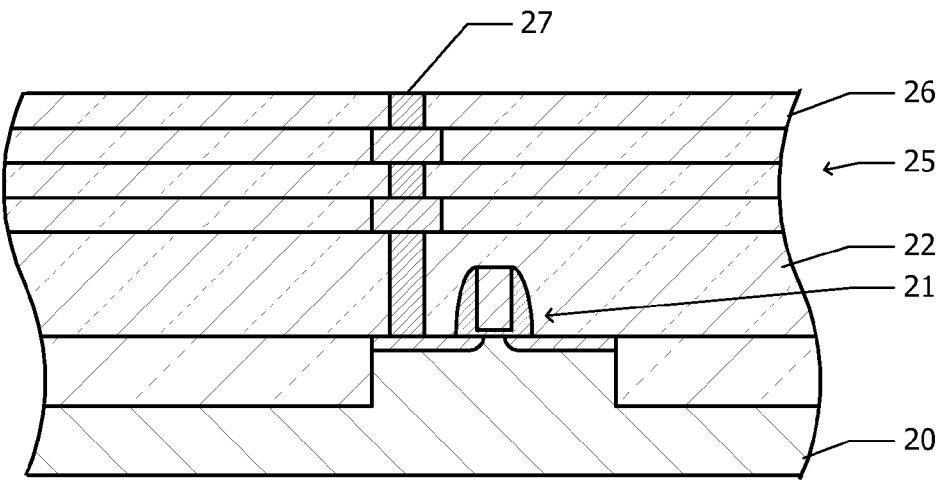
FIG. 2A to FIG. 2K are cross-sectional views of a magnetic storage device at an intermediate stage of manufacture in accordance with a method for manufacturing a magnetic storage device of the first embodiment.

As illustrated in FIG. 2A, a transistor 21 is formed on a semiconductor substrate 20. The transistor 21 corresponds to a transistor 10 illustrated in FIG. 1A. On the semiconductor substrate 20, an interlayer insulating film 22 which covers the transistor 21 is formed. On the interlayer insulating film 22, a multilayer wiring layer 25 is formed. A conductive plug 27 is embedded in an interlayer insulating film 26, which is an uppermost layer of the multilayer wiring layer 25. The conductive plug 27 is connected to a drain of the transistor 21 through a conductive plug or a wiring in the multilayer wiring layer 25 and the interlayer insulating film 22.

Figure 2B:
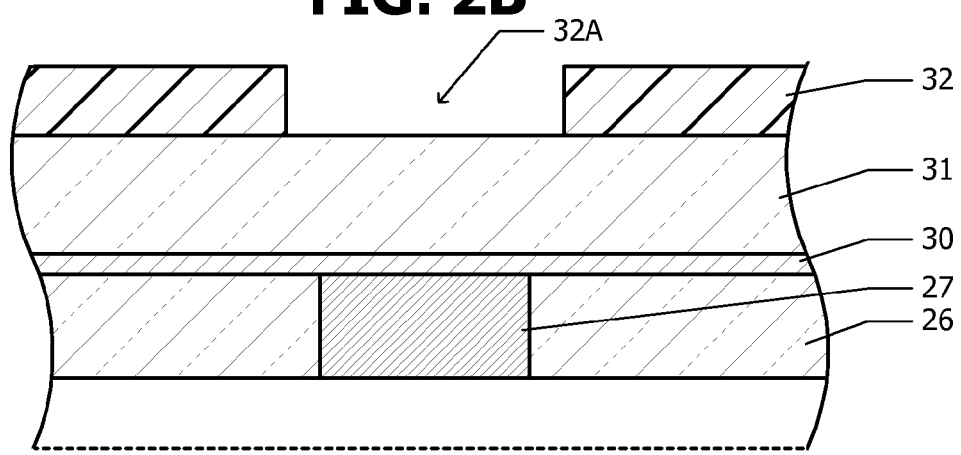

As illustrated in FIG. 2B, a lower conductive film 30 is formed on the interlayer insulating film 26. The lower conductive film 30 is electrically connected to the conductive plug 27. For the lower conductive film 30, for example, non-magnetic materials such as Ta and Ru are used, and the thickness thereof is within a range of 30 nm to 50 nm. For forming the lower conductive film 30, for example, physical vapor deposition (PVD) is used. The lower conductive film 30 may be constituted by three layers of a Ta film, a Ru film and a Ta film. In such a case, the thickness of the lower Ta film is adjusted to be within a range of 3 nm to 20 nm, that of the Ru film to be within a range of 0 to 50 nm, and that of the upper Ta film to be within a range of 10 nm to 20 nm.

On the lower conductive film 30, a first insulating film 31 is formed. For the first insulating film 31, for example, silicon oxide, silicon nitride, alumina or the like is used, and the thickness thereof is about 150 nm. Preferably, the first insulating film 31 is formed at a temperature equal to or lower than 400° C. in order to keep a copper wiring in the underlying layer from deteriorating. As an example, plasma-enhanced chemical vapor deposition (PE-CVD) can be employed for forming the first insulating film 31.

A mask pattern 32 is formed by forming a photoresist film on the first insulating film 31, and exposing and developing the photoresist film. The thickness of the photoresist film is adjusted, for example, to be 200 nm, and an ArF excimer laser is used for exposure. In the mask pattern 32, an opening 32A is formed which partially overlaps the conductive plug 27 in planar view.

Figure 2C:
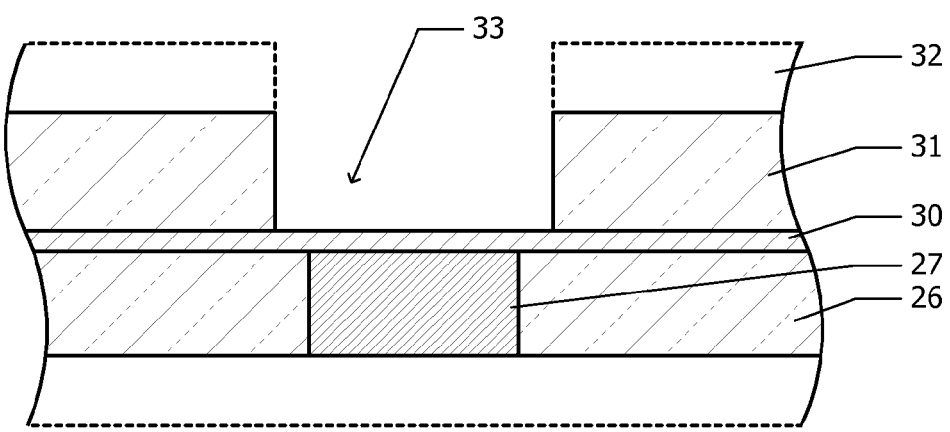

As illustrated in FIG. 2C, an opening (recess) 33 is formed by etching the first insulating film 31 with the mask pattern 32 serving as an etching mask. For the etching of the first insulating film 31, for example, reactive ion etching (RIE) using a capacitively coupled plasma of a CF-based gas is applied. The opening 33 reaches the lower conductive film 30, and the lower conductive film 30 is exposed through the opening 33. After forming the opening 33, the mask pattern 32 is removed.

Figure 2D:
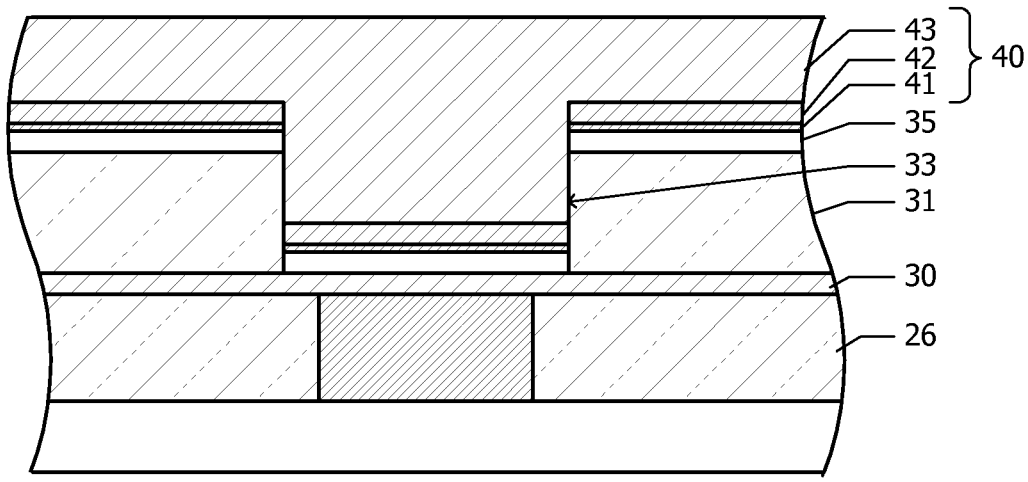

As illustrated in FIG. 2D, an MTJ multilayer film 35 is deposited on the lower conductive film 30 in the opening 33, and on the first insulating film 31.

Figure 2E:
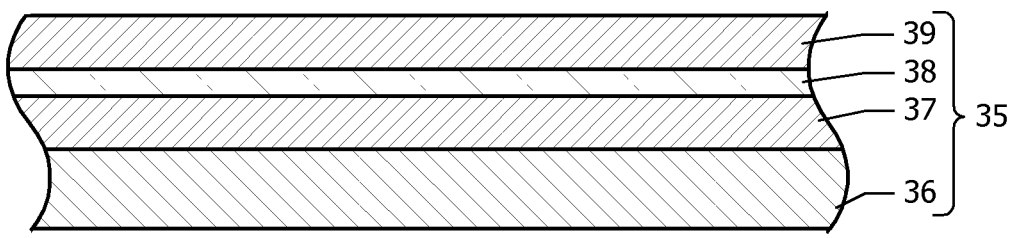

FIG. 2E illustrates a cross-sectional view of the MTJ multilayer film 35. The MTJ multilayer film 35 includes an antiferromagnetic layer 36, a pinned layer 37, a tunnel barrier layer 38 and a free layer 39, which are stacked in the recited order from the substrate upwards. For the antiferromagnetic layer 36, for example, an antiferromagnetic material such as PtMn is used, and the thickness thereof is within a range of, for example, 10 nm to 20 nm. The pinned layer 37 includes, for example, a CoFe layer whose thickness is within a range of 1.5 nm to 3.5 nm, a Ru layer whose thickness is within a range of 0.8 nm to 1.6 nm, and a CoFeB layer whose thickness is within a range of 1.5 nm to 3.5 nm, which are stacked in the recited order from the substrate upwards. The pinned layer 37 is exchange-coupled with the antiferromagnetic layer 36, so that the magnetization direction thereof is fixed. For the tunnel barrier layer 38, for example, MgO is used, and the thickness thereof is within a range of, for example, 0.9 nm to 1.1 nm. For the free layer 39, for example, CoFeB is used, and the thickness thereof is within a range of, for example, 1.5 nm to 2 nm.

For forming the MTJ multilayer film 35, a method for forming a film in which a growth direction of the film is predominantly perpendicular to a substrate surface, for example, long throw PVD, PVD using a collimator, or the like, is applied. For this reason, there occurs almost no deposition of the MTJ multilayer film 35 on the side surface of the opening 33. Therefore, side surfaces (end surfaces) of the antiferromagnetic layer 36, the pinned layer 37, the tunnel barrier layer 38 and the free layer 39, which constitute the MTJ multilayer film 35 in the opening 33, are in contact with the first insulating film 31.

Returning to FIG. 2D, an upper conductive film 40 is formed on the MTJ multilayer film 35. The opening 33 is filled with the upper conductive film 40. The upper conductive film 40 includes, for example, a Ta film 41 whose thickness is within a range of 0.5 nm to 2 nm, a Ru film 42 whose thickness is within a range of 3 nm to 10 nm, a Ta film 43 whose thickness is within a range of 30 nm to 100 nm, which are stacked in the recited order from the substrate upwards. For forming these films, a method for forming a film in which a growth direction of the film is predominantly perpendicular to a substrate surface, for example, long throw PVD, PVD using a collimator, or the like, is applied. For forming the upper Ta film 43, a method for forming a film suitable for filling the opening 33 may be applied.

In FIG. 2D, the top surface of the upper conductive film 40 is illustrated as being substantially planar. However, a recess which reflects the opening 33 may be formed on the top surface. In such a case, the bottom of the recess is preferably at a higher level than the top surface of the first insulating film 31. Further, it is preferable to keep a high-vacuum atmosphere during the period from the formation of the MTJ multilayer film 35 to the formation of the upper conductive film 40. The high-vacuum atmosphere can be kept during the period from the formation of the MTJ multilayer film 35 to the formation of the upper conductive film 40, for example, by using a multi-chamber film-forming apparatus.

Figure 2F:
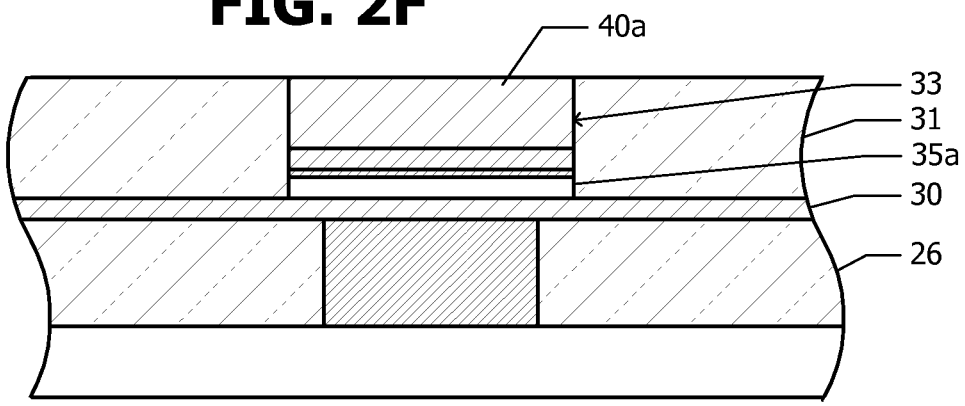

As illustrated in FIG. 2F, the upper conductive film 40 and the MTJ multilayer film 35 are subjected to chemical mechanical polishing (CMP) until the first insulating film 31 is exposed. For the CMP, for example, an $Al_2O_3$ slurry is used. An MTJ device 35a composed of the MTJ multilayer film 35 remains in the opening 33. An upper electrode 40a composed of the upper conductive film 40 remains on the MTJ device 35a. The top surface of the upper electrode 40a is at the same level as the top surface of the first insulating film 31. Further, the outer periphery of the upper electrode 40a matches that of the MTJ device 35a.

Instead of CMP, an etch back process may be applied. In addition, CMP and the etch back process may be applied in combination. For example, in FIG. 2D, CMP may be applied until the top surface of the MTJ multilayer film 35 deposited on the first insulating film 31 is exposed, and then the etch back process may be applied.

Figure 2G:
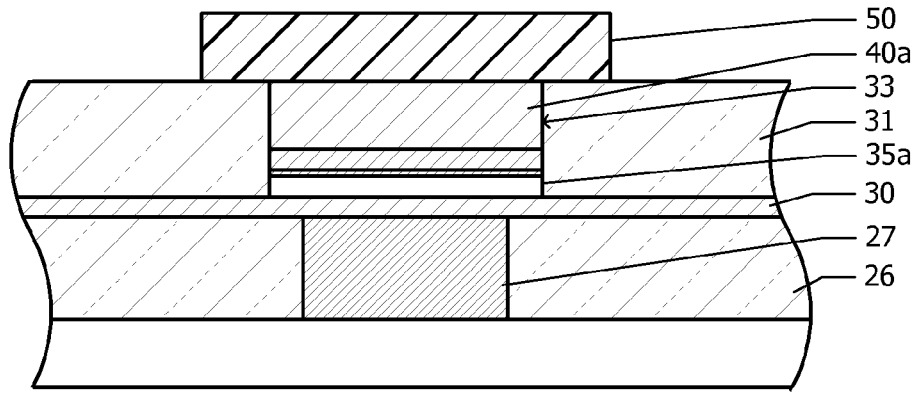

As illustrated in FIG. 2G, the top of the upper electrode 40a (that is, the top of the MTJ device 35a) and a region on the top surface of the first insulating film 31 which surrounds the MTJ device 35a are covered with a mask pattern 50. A general photoresist is used for the mask pattern 50. For exposure of the photoresist, for example, a KrF excimer laser is used. The thickness of the mask pattern 50 is adjusted, for example, to be about 250 nm. Further, the mask pattern 50 is aligned in such a way that it overlaps, at least partially, the conductive plug 27.

The first insulating film 31 and the lower conductive film 30 are etched with the mask pattern 50 serving as an etching mask. For example, RIE is applied to the etching. A CF-based gas is used for the etching of the first insulating film 31 and a $Cl_2$-based gas is used for the etching of the lower conductive film 30.

Figure 2H:
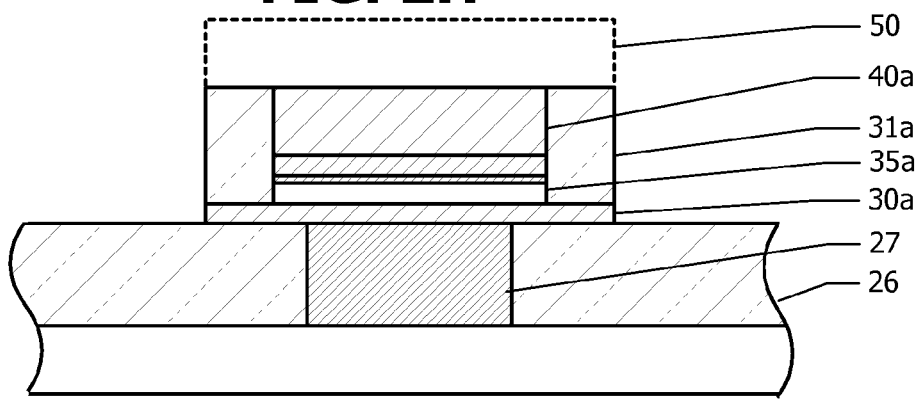

As illustrated in FIG. 2H, there remains the first insulating film 31a having a planar shape matching the outer periphery of the mask pattern 50. A lower electrode 30a composed of the lower conductive film 30 remains under the MTJ device 35a and the first insulating film 31a. The outer periphery of the lower electrode 30a matches that of the first insulating film 31a thereabove. The mask pattern 50 is removed after the lower electrode 30a is formed.

Since the side surfaces of the MTJ device 35a are protected by the first insulating film 31a, the MTJ device 35a is impervious to damage caused by an etching environment when the lower conductive film 30 (FIG. 2G) is patterned. Therefore, a milling process using Ar ions and the like can be applied to the patterning of the lower conductive film 30, as well. In addition, an increase in leakage current can be suppressed because a product generated during etching does not adhere to the side surfaces of the MTJ device 35a.

Figure 2I:
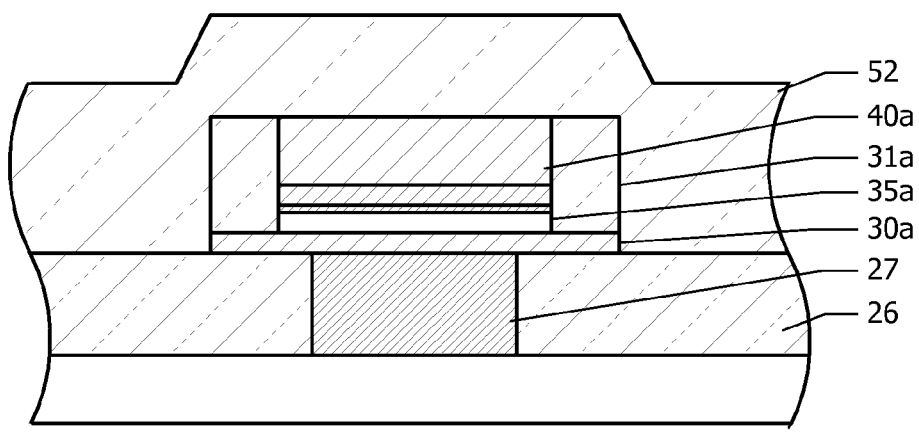

As illustrated in FIG. 2I, a second insulating film 52 is deposited on an interlayer insulating film 26. The second insulating film 52 covers the MTJ device 35a, the upper electrode 40a and the first insulating film 31a. For the second insulating film 52, for example, an insulating material such as silicon oxide, fluorine-doped silicon oxide (SiOF) and carbon-doped silicon oxide (SiOC) is used. The second insulating film 52 is deposited preferably at a temperature equal to or lower than 400° C., more preferably at a temperature equal to or lower than 350° C. For the deposition of the second insulating film 52, for example, PE-CVD is applied.

The first insulating film 31a only slightly remains around the MTJ device 35a. In contrast, the second insulating film 52 is used as an interlayer insulating film for providing insulation between an upper wiring and a lower wiring. For this reason, it is preferable to use a material with lower permittivity for the second insulating film 52 in comparison with the first insulating film 31a.

Figure 2J:
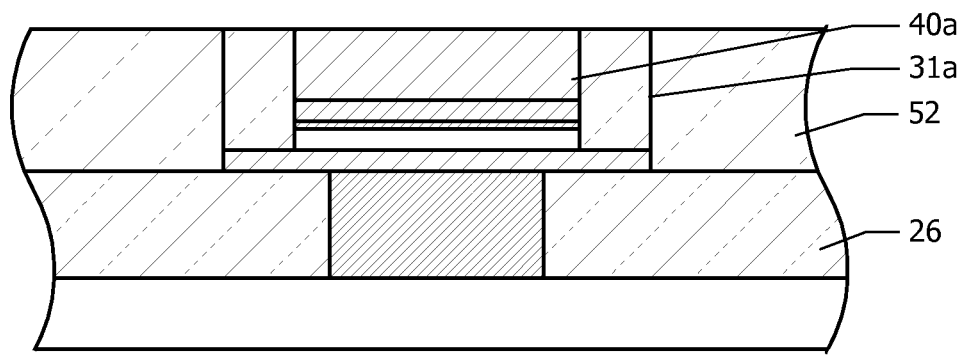

As illustrated in FIG. 2J, the second insulating film 52 is subjected to CMP until the upper electrode 40a is exposed, and thereby surface planarization is performed. In the CMP, a silica-based slurry is used. A stopper film for CMP such as a silicon nitride film or the like may be formed before the deposition of the second insulating film 52 illustrated in FIG. 2I. Controllability of the CMP can be enhanced by forming the stopper film for CMP in advance.

Figure 2K:
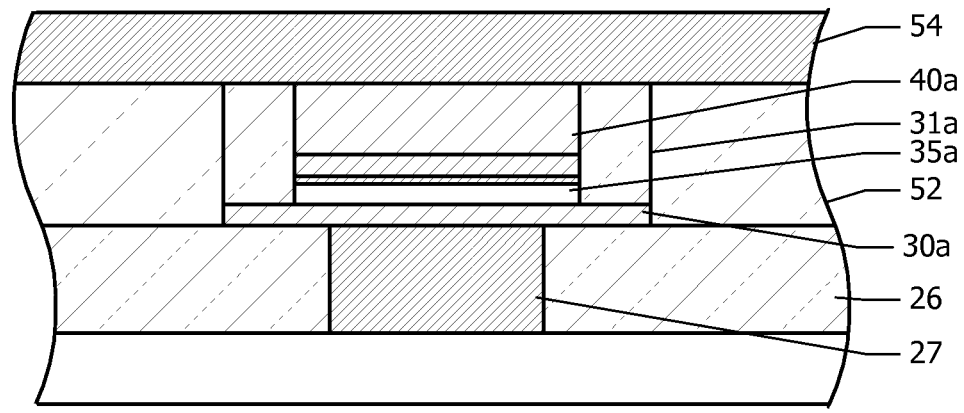

As illustrated in FIG. 2K, a wiring 54 is formed on the second insulating film 52 and the upper electrode 40a. The wiring 54 corresponds to the bit line 14 illustrated in FIG. 1A.

In the first embodiment, the MTJ device 35a is connected to the conductive plug 27 in the underlying layer through the lower electrode 30a. The dimensions of the MTJ device 35a in in-plane directions are adjusted, in general, to be about 0.1 μm in order to make the magnetization directions uniform in a magnetic film. It is difficult to align the MTJ device 35a, which is microscopic as described above, and the conductive plug 27 in the underlying layer with a sufficient accuracy in such a way that the MTJ device 35a and the conductive plug 27 are electrically connected to each other.

In the first embodiment, at the time when the opening 33 (FIG. 2C) which defines the position of the MTJ device 35a is formed, the lower conductive film 30 has been formed on the entire surface of the substrate. For this reason, there is no need to align the opening 33 and the lower conductive film 30 when forming the opening 33. The yield rate of the electrical connection between the MTJ device 35a and the conductive plug 27 in the underlying layer depends on the accuracy of the alignment of the lower electrode 30a and the conductive plug 27. As the lower electrode 30a is larger than the MTJ device 35a, a larger alignment margin can be secured in comparison to the case where the MTJ device 35a and the conductive plug 27 are directly connected to each other.

In the first embodiment, as illustrated in FIG. 2E, the antiferromagnetic layer 36 and the pinned layer 37 are disposed under the tunnel barrier layer 38 and the free layer 39 is disposed on the tunnel barrier layer 38. However, these layers can be disposed in the inverse order with respect to the vertical direction. For example, the free layer 39, the tunnel barrier layer 38, the pinned layer 37, and the antiferromagnetic layer 36 may be stacked in the recited order from the substrate upwards.

Second Embodiment

A method for manufacturing a magnetic storage device according to the second embodiment is described with reference to FIG. 3A to FIG. 3F.

The configuration illustrated in FIG. 3A is the same as that illustrated in FIG. 2F of the first embodiment.

As illustrated in FIG. 3B, the first insulating film 31 (FIG. 3A) is removed. For removing the first insulating film 31, for example, RIE using a CF-based gas can be applied. Under this condition, the first insulating film 31 can be selectively removed with respect to the upper electrode 40a and the MTJ device 35a. The lower conductive film 30 is exposed in a region where the first insulating film 31 is removed.

As illustrated in FIG. 3C, the exposed lower conductive film 30 (FIG. 3B) is removed. For removing the lower conductive film 30, for example, RIE using a $Cl_2$-based gas can be applied. At this time, the side surfaces of the MTJ device 35a are exposed. However, in comparison to the case where a lower conductive film is patterned with the use of physical milling, a product is less likely to adhere to the side surfaces. Therefore, it is possible to suppress an increase in leakage current caused by the product adhered to the side surfaces. The lower electrode 30a composed of the lower conductive film 30 remains under the MTJ device 35a.

Figure 3D:
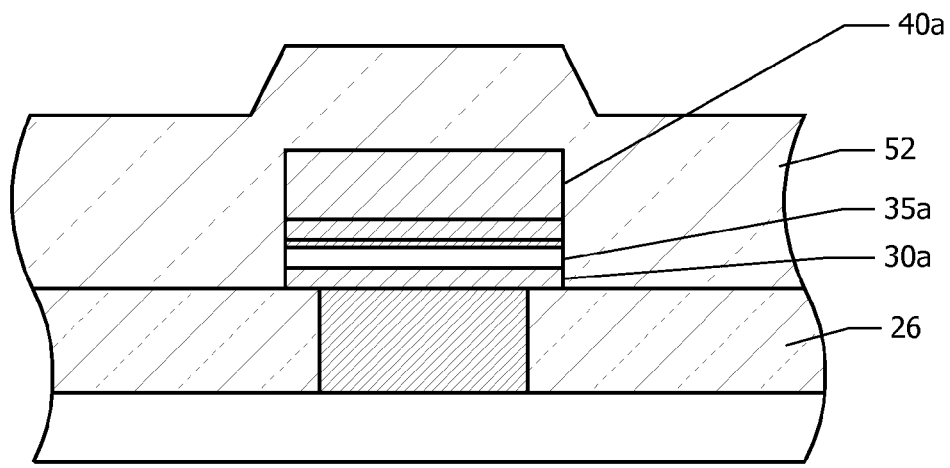

As illustrated in FIG. 3D, the second insulating film 52 is formed on the interlayer insulating film 26. The second insulating film 52 covers the upper electrode 40a, the MTJ device 35a, and the lower electrode 30a. For forming the second insulating film 52, the same method is applied as that used for the formation of the second insulating film 52 illustrated in FIG. 2I of the first embodiment.

Figure 3E:
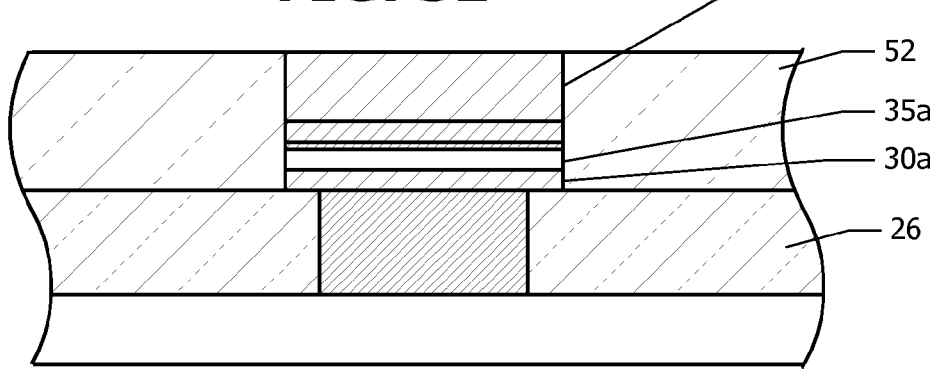

As illustrated in FIG. 3E, the second insulating film 52 is subjected to CMP until the upper electrode 40a is exposed. The condition of the CMP is the same as that of the CMP of the second insulating film 52 illustrated in FIG. 23 of the first embodiment. By the CMP, the top surfaces of the second insulating film 52 and the upper electrode 40a are planarized.

Figure 3F:
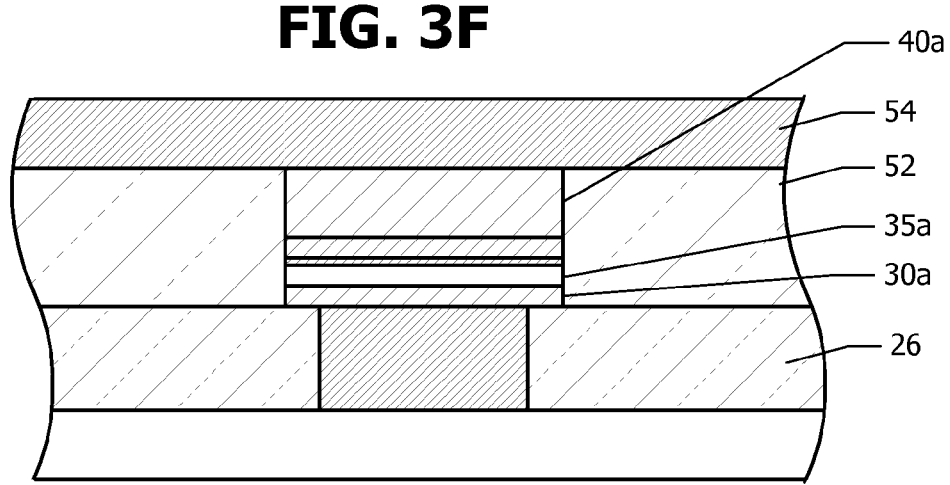

As illustrated in FIG. 3F, the wiring 54 is formed on the planarized second insulating film 52 and upper electrode 40a.

In the second embodiment, there is no need to form the mask pattern 50 illustrated in FIG. 2G of the first embodiment. Therefore, the number of steps can be reduced in comparison to the method in the first embodiment.

Third Embodiment

Figure 4A:
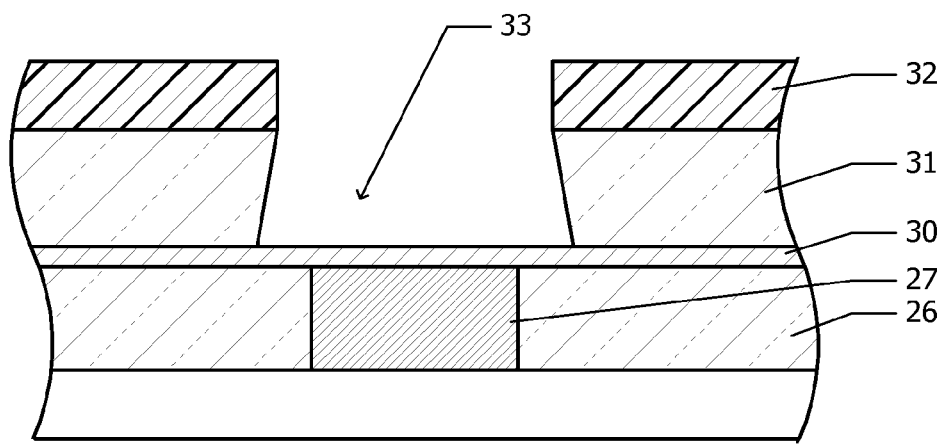
FIG. 4A is a cross-sectional view of a magnetic storage device at an intermediate stage of manufacture in accordance with a method for manufacturing a magnetic storage device of the third embodiment.

FIG. 4A illustrates a cross-sectional view of a magnetic storage device at an intermediate stage of manufacture in accordance with a method for manufacturing a magnetic storage device of the third embodiment. FIG. 4A corresponds to the stage illustrated in FIG. 2C of the first embodiment. In the first embodiment, the side surface of the opening 33 is substantially perpendicular to the substrate surface. In the third embodiment, the side surface of the opening 33 has a reverse-tapered shape. That is, the planar cross-sectional area of the opening 33 gradually decreases from the substrate upward. Other steps are the same as those in the first embodiment.

Because the side surface of the opening 33 has a reverse-tapered shape, when the MTJ multilayer film 35 illustrated in FIG. 2D is formed, the MTJ multilayer film 35 is less likely to adhere to the side surface of the opening 33 in comparison to the case of the first embodiment.

Figure 4B:
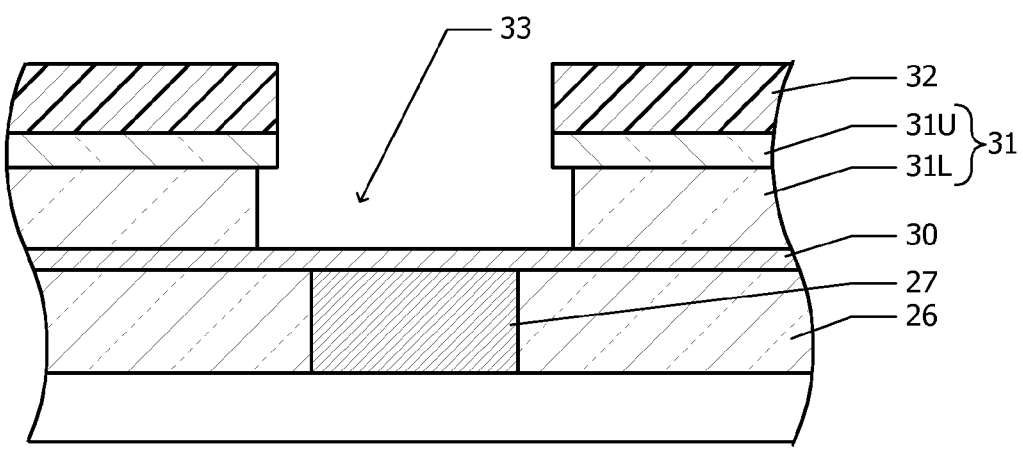
FIG. 4B is a cross-sectional view of a magnetic storage device at an intermediate stage of manufacture in accordance with a method for manufacturing a magnetic storage device of a variation of the third embodiment.

FIG. 4B illustrates a cross-sectional view of a magnetic storage device at an intermediate stage of manufacture in accordance with a method for manufacturing a magnetic storage device of a variation of the third embodiment. In this variation, the first insulating film 31 includes a lower part 31L and an upper part 31U which have different etching resistances from each other. First, an opening is formed in the upper part 31U with a mask pattern 32 serving as an etching mask. Then, the lower part 31L is etched in a thickness direction and in a lateral direction with the upper part 31U serving as an etching mask. An eave-like part projecting from the side surface of the opening 33 toward the center thereof is formed by the upper part 31U.

Because the eave-like part is formed, the MTJ multilayer film 35 is less likely to adhere to the side surface of the opening 33 when the MTJ multilayer film 35 illustrated in FIG. 2D is formed, in comparison to the case of the first embodiment.

Fourth Embodiment

A method for manufacturing a magnetic storage device according to the fourth embodiment is described with reference to FIG. 5A and FIG. 5B. In the following description, differences from the method according to the first embodiment are focused on, and duplicate description regarding the same configuration as that of the first embodiment will be avoided. In the first embodiment, as illustrated in FIG. 2A, the interlayer insulating film 26 and the conductive plug 27 are included in the uppermost layer of the multilayer wiring layer 25, which is placed under the layer on which the MTJ device 35a is disposed. This makes the lower electrode 30a (FIG. 2H) of the MTJ device 35a in contact with the conductive plug 27 disposed thereunder.

As illustrated in FIG. 5A, in the fourth embodiment, an interlayer insulating film 60 and a wiring 61 are included in the uppermost layer of the multilayer wiring layer 25, which is placed under the layer on which the MTJ device is disposed.

As illustrated in FIG. 5B, on the wiring 61 and the interlayer insulating film 60, the lower electrode 30a to be connected to the MTJ device 35a is disposed. The wiring 61 extends, for example, in a direction perpendicular to the plane of paper of FIG. 5B. More than one MTJ devices 35a are aligned discretely, for example, at regular intervals, along the wiring 61.

In the configuration of the fourth embodiment, the second insulating film 52 on which the MTJ device 35a is disposed can be used as a via layer for disposing the conductive plug.

Fifth Embodiment

A method for manufacturing a magnetic storage device according to the fifth embodiment is described with reference to FIG. 6A to FIG. 6C. In the following description, differences from the methods according to the first embodiment and the fourth embodiment are focused on, and duplicate description regarding the same configuration as that of the first embodiment and the fourth embodiment will be avoided.

Figure 6A:
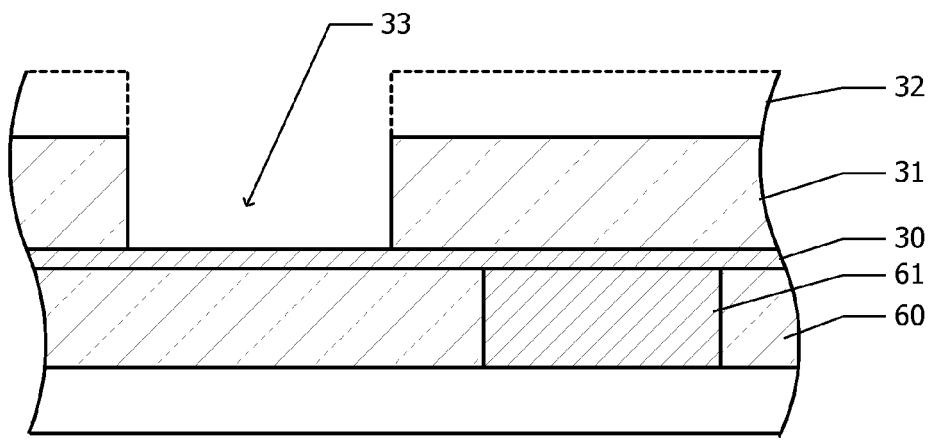
FIG. 6A to FIG. 6C are cross-sectional views of a magnetic storage device at an intermediate stage of manufacture in accordance with a method for manufacturing a magnetic storage device of the fifth embodiment.

FIG. 6A corresponds to the cross-sectional view of a magnetic storage device at the stage illustrated in FIG. 2C of the first embodiment. Under the lower conductive film 30, the interlayer insulating film 60 and the wiring 61 illustrated in FIG. 5A of the fourth embodiment are disposed. The lower conductive film 30 is disposed on the interlayer insulating film 60 and the wiring 61. That is, an underlying surface of the lower conductive film 30 includes an insulating region (the interlayer insulating film 60) and a conductive region (the wiring 61). The lower conductive film 30 covers the whole area of the interlayer insulating film 60 and the wiring 61. The opening 33 formed in the first insulating film 31 is disposed in a position not overlapping the wiring 61.

Figure 6B:
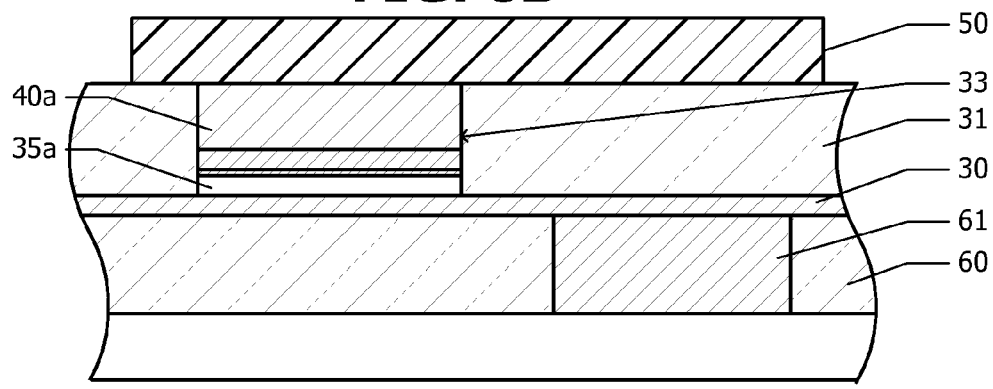

As illustrated in FIG. 6B, the MTJ device 35a and the upper electrode 40a are formed in the opening 33. Formation of the MTJ device 35a and the upper electrode 40a is performed in a common manner with the steps illustrated in FIG. 2D to FIG. 2F of the first embodiment. A mask pattern 50 is formed on the first insulating film 31 and the upper electrode 40a. The mask pattern 50 reaches from a region encompassing the opening 33 to a region partially overlapping the wiring (conductive region) 61. The first insulating film 31 and the lower conductive film 30 are etched with the mask pattern 50 serving as an etching mask. After performing the etching, the mask pattern 50 is removed.

Figure 6C:
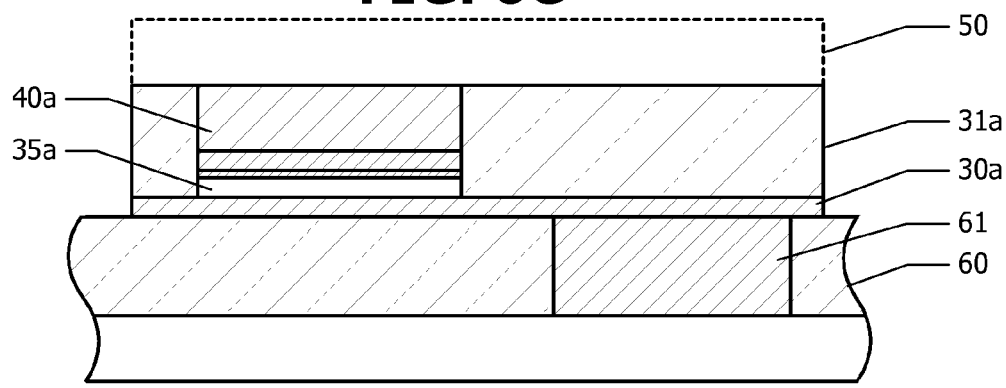

As illustrated in FIG. 6C, the first insulating film 31a surrounding the MTJ device 35a, and the lower electrode 30a are formed. The lower electrode 30a connects the wiring 61 and the MTJ device 35a electrically. Subsequent steps are in common with the steps illustrated in FIG. 2I to FIG. 2K of the first embodiment.

In the fifth embodiment, the MTJ device 35a is disposed not in a region where the wiring 61 is disposed but on the interlayer insulating film 60. Therefore, planarity of the underlying part of the MTJ device 35a can be further enhanced.

Sixth Embodiment

A method for manufacturing a magnetic storage device according to the sixth embodiment is described with reference to FIG. 7A to FIG. 7D. In the following description, differences from the method according to the first embodiment are focused on, and duplicate description regarding the same configuration as that of the first embodiment will be avoided.

Figure 7A:
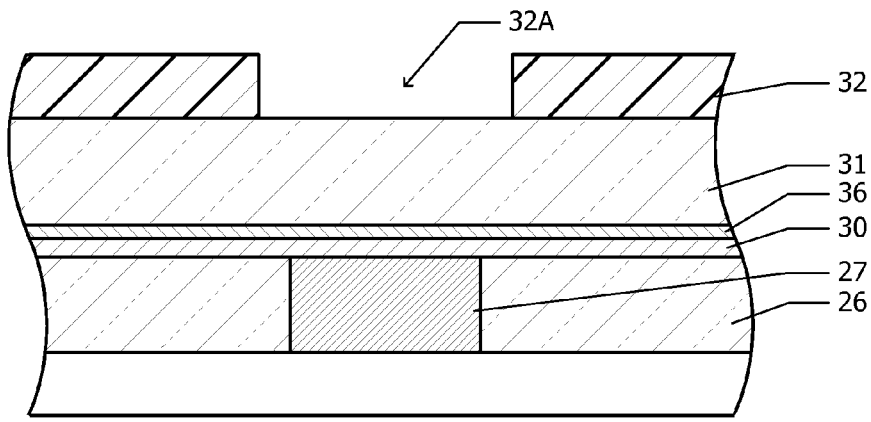
FIG. 7A to FIG. 7D are cross-sectional views of a magnetic storage device at an intermediate stage of manufacture in accordance with a method for manufacturing a magnetic storage device of the sixth embodiment.

FIG. 7A corresponds to the cross-sectional view of a magnetic storage device at the stage illustrated in FIG. 2B of the first embodiment. In the first embodiment, the first insulating film 31 is formed in such a way that it is in contact with the lower conductive film 30. In the sixth embodiment, the antiferromagnetic layer 36 is formed between the lower conductive film 30 and the first insulating film 31. The antiferromagnetic layer 36 corresponds to the antiferromagnetic layer 36 illustrated in FIG. 2E of the first embodiment.

Figure 7B:
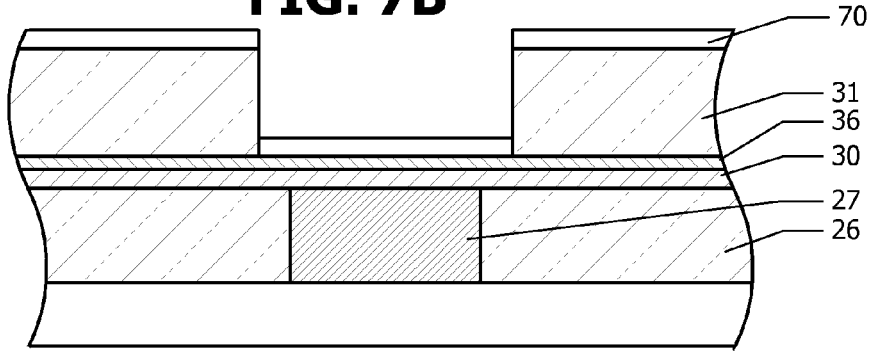
Figure 7C:
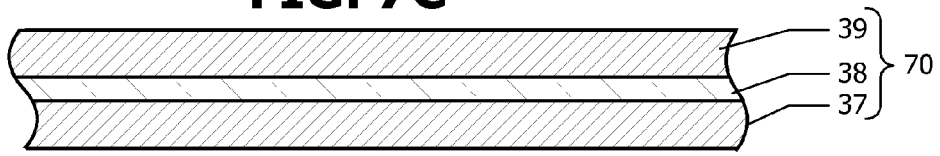

FIG. 7B corresponds to the cross-sectional view of a magnetic storage device at the stage of forming the MTJ multilayer film 35 illustrated in FIG. 2D of the first embodiment. In the first embodiment, the MTJ multilayer film 35 in the opening 33 and on the first insulating film 31 includes the antiferromagnetic layer 36. In the sixth embodiment, layers 70, which are layers other than the antiferromagnetic layer 36 in the MTJ multilayer film 35, are formed in the opening 33 and on the first insulating film 31. The layers 70 other than the antiferromagnetic layer 36, include the pinned layer 37, the tunnel barrier layer 38 and the free layer 39 as illustrated in FIG. 7C. At this time, the antiferromagnetic layer 36 is disposed on the entire surface of the substrate as is the lower conductive film 30.

Figure 7D:
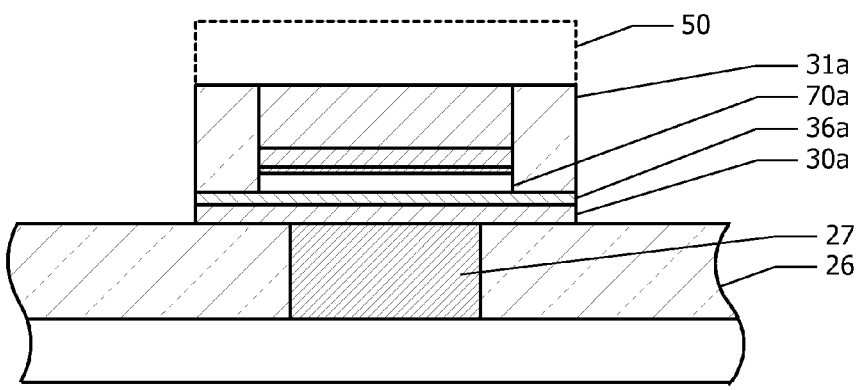

FIG. 7D corresponds to the cross-sectional view of a magnetic storage device at the stage illustrated in FIG. 2H of the first embodiment. The first insulating film 31, the antiferromagnetic layer 36 and the lower conductive film 30 illustrated in FIG. 7B are etched with the mask pattern 50 serving as an etching mask. By performing the etching, the first insulating film 31a, the antiferromagnetic layer 36a and the lower electrode 30a remain. The outer periphery of the antiferromagnetic layer 36a matches that of the first insulating film 31a and that of the lower electrode 30a. Etching conditions of the antiferromagnetic layer 36 are identical to those of the lower conductive film 30.

As described above, in the sixth embodiment, a certain film (for example, the antiferromagnetic layer 36) in the MTJ multilayer film disposed under the tunnel barrier layer 38 is formed between the lower conductive film 30 and the first insulating film 31 in the step of depositing the MTJ multilayer film. The other films (for example, the pinned layer 37, the tunnel barrier layer 38 and the free layer 39) are formed on the first insulating film. Subsequently, in the step of forming the lower electrode 30a (FIG. 7D), the certain film (the antiferromagnetic layer 36) in the MTJ multilayer film formed between the lower conductive film 30 and the first insulating film 31 is patterned into the same planar shape as the lower electrode 30a.

Also in the sixth embodiment, as in the first embodiment, the side surfaces of the tunnel barrier layer 38 are protected by the first insulating film 31a. For this reason, the layers 70 other than the antiferromagnetic layer in the MTJ device are impervious to damage caused by an etching atmosphere when the lower conductive film 30 (FIG. 7B) is patterned. Because the side surfaces of the antiferromagnetic layer 36a are apart from the side surfaces of the tunnel barrier layer 38, damage given to the side surfaces of the antiferromagnetic layer 36a has little adverse effect on the properties of the MTJ device.

In the sixth embodiment, the layers 70 formed in the opening 33 are thinner than the MTJ multilayer film 35 illustrated in FIG. 2D of the first embodiment. For this reason, adherence to the side surface of the opening 33 upon film formation is further suppressed.

Seventh Embodiment

A method for manufacturing a magnetic storage device according to the seventh embodiment is described with reference to FIG. 8A to FIG. 8E. In the following description, differences from the method according to the first embodiment are focused on, and duplicate description regarding the same configuration as that of the first embodiment will be avoided. In the first embodiment, as illustrated in FIG. 2D, the MTJ multilayer film 35 is thinner than the first insulating film 31. For this reason, the MTJ multilayer film 35 does not completely fill up the space in the opening 33. The inner space of the opening 33 is filled with the upper conductive film 40.

Figure 8A:
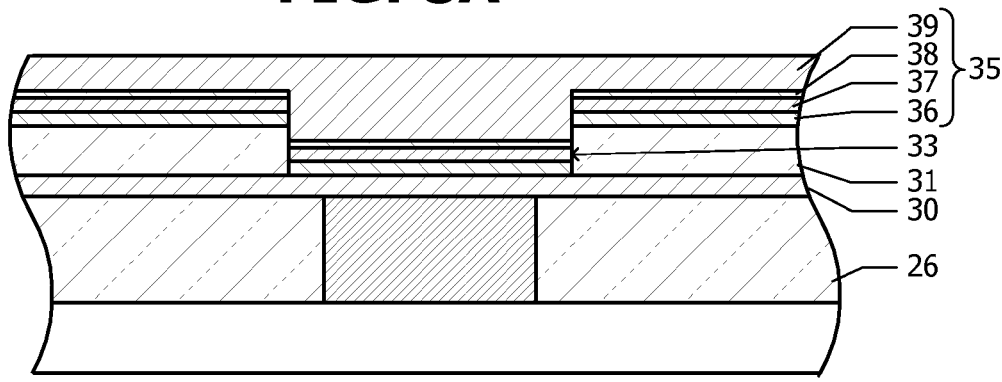
FIG. 8A to FIG. 8E are cross-sectional views of a magnetic storage device at an intermediate stage of manufacture in accordance with a method for manufacturing a magnetic storage device of the seventh embodiment.

As illustrated in FIG. 8A, in the seventh embodiment, the first insulating film 31 is thinner than the MTJ multilayer film 35. For this reason, the space in the opening 33 is completely filled with the MTJ multilayer film 35. For example, the top surface of the tunnel barrier layer 38 in the opening 33 is located at a lower level than that of the first insulating film 31 and the inner space of the opening 33 is completely filled with the free layer 39. That is, the top surface of the free layer 39 in a region where the opening 33 is formed is located at a higher level than that of the first insulating film 31. In the seventh embodiment, the upper conductive film 40 illustrated in FIG. 2D has not yet formed at this stage.

Figure 8B:
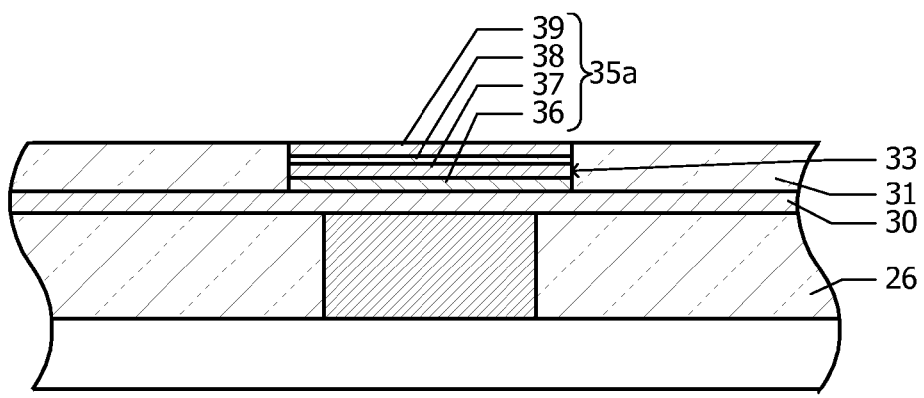

As illustrated in FIG. 8B, the MTJ multilayer film 35 is subjected to CMP until the first insulating film 31 is exposed. In the opening 33, there remains the MTJ device 35a in which the antiferromagnetic layer 36, the pinned layer 37, the tunnel barrier layer 38 and the free layer 39 are stacked in the recited order.

Figure 8C:
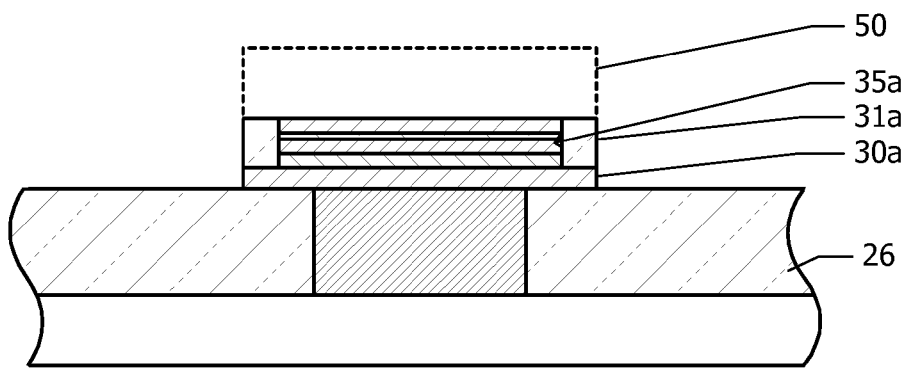

As illustrated in FIG. 8C, the MTJ device 35a and the first insulating film 31 around the MTJ device 35a are covered with the mask pattern 50, and the first insulating film 31 (FIG. 8B) and the lower conductive film 30 (FIG. 8B) are etched. As a result, the first insulating film 31a surrounding the MTJ device 35a and the lower electrode 30a are formed. After forming the lower electrode 30a, the mask pattern 50 is removed.

Figure 8D:
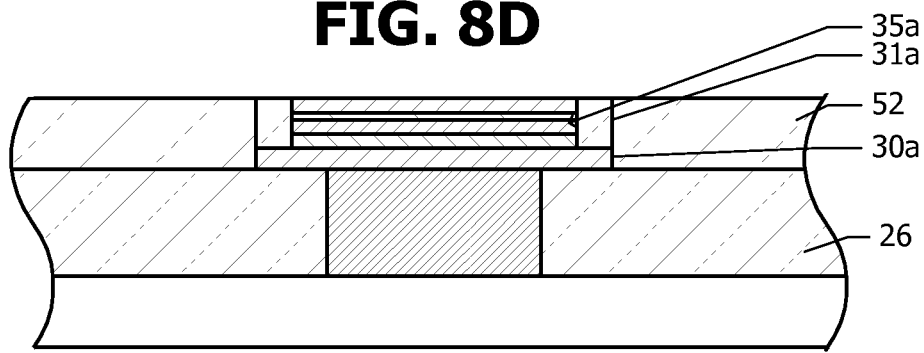

As illustrated in FIG. 8D, the second insulating film 52 is deposited on the interlayer insulating film 26, and the second insulating film 52 is subjected to CMP until the MTJ device 35a is exposed. As a result, the top surfaces of the MTJ device 35a and the second insulating film 52 are located at the same level and are planarized.

Figure 8E:
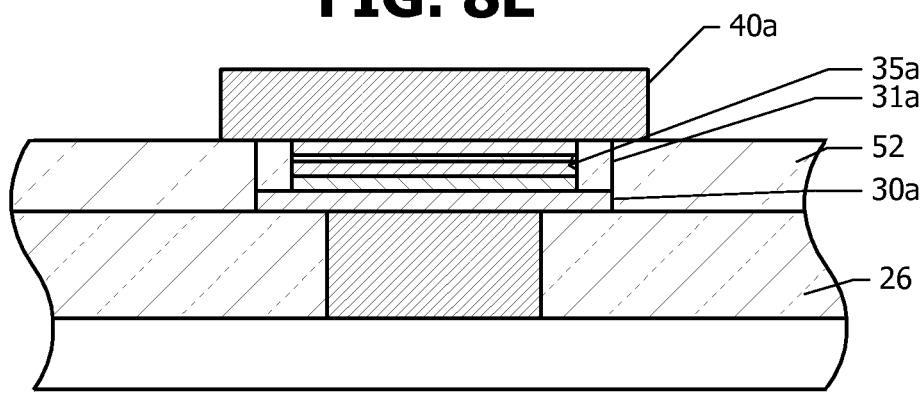

As illustrated in FIG. 8E, the upper electrode 40a is formed on the second insulating film 52. The upper electrode 40a includes, like the upper conductive film 40 illustrated in FIG. 2D, the lower Ta film, the Ru film and the upper Ta film. The upper electrode 40a and the wiring 54 connected to the upper electrode 40a illustrated in FIG. 2K may be formed by performing patterning simultaneously.

In the seventh embodiment, the inner space of the opening 33 is filled with the MTJ multilayer film 35 (FIG. 8A), the second insulating film 52 (FIG. 8E) is formed, and then the upper electrode 40a is formed. Also in the seventh embodiment, the side surfaces of the MTJ device 35a are protected by the first insulating film 31a in the step of patterning the lower conductive film 30 (FIG. 8C). In addition, the lower electrode 30a is larger than the MTJ device 35a. Therefore, the same effect as the first embodiment can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. A method for manufacturing a magnetic storage device comprising:
   forming lower conductive film over a substrate;
   forming a first insulating film over the lower conductive film;
   forming an opening in the first insulating film, the opening reaching the lower conductive film and the lower conductive film being exposed through the opening;
   depositing an MTJ multilayer film including a magnetization free layer, a tunnel barrier layer and a magnetization fixed layer over the lower conductive film in the opening and over the first insulating film;
   forming, by removing the MTJ multilayer film deposited over the first insulating film, an MTJ device including the MTJ multilayer film which has remained in the opening;
   forming, by partially removing the first insulating film, a protection film including the first insulating film around the MTJ device, the protection film protecting a side surface of the MTJ device; and
   forming, by partially removing the lower conductive film, a lower electrode including the lower conductive film under the MTJ device and the protection film, an outer periphery of the lower electrode matching an outer periphery of the protection film.

2. The method for manufacturing the magnetic storage device according to claim 1, wherein
   the depositing the MTJ multilayer film further comprises depositing an upper conductive film over the magnetization free layer, the tunnel barrier layer and the magnetization fixed layer in the opening; and
   the forming the MTJ device further comprises forming, by removing at least a portion of the upper conductive film deposited over the first insulating film, an upper electrode including a remaining portion of the upper conductive film which is maintained over the MTJ device.

3. The method for manufacturing the magnetic storage device according to claim 1, wherein the forming the lower electrode comprises:
   forming a mask pattern which covers the MTJ device over the first insulating film;
   removing the first insulating film and the lower conductive film with the mask pattern used as a mask; and
   removing the mask pattern.

4. The method for manufacturing the magnetic storage device according to claim 3, wherein:
   a surface of the substrate comprises an insulating region and a conductive region;
   in the forming the opening, the opening is formed in the insulating region; and
   the mask pattern covers a region partially overlapping the conductive region.

5. The method for manufacturing the magnetic storage device according to claim 1, wherein:
   in the depositing the MTJ multilayer film, a first film of the MTJ multilayer film, which is disposed closer to the substrate than the tunnel barrier layer is, is formed between the lower conductive film and the first insulating film, and a second film of the MTJ multilayer film, which is disposed at an opposite side of the tunnel barrier layer from the first film, is formed over the first insulating film; and
   in the forming the lower electrode, the first film of the MTJ multilayer film is patterned into a same planar shape as the lower electrode.

6. The method for manufacturing the magnetic storage device according to claim 1, wherein a side surface of the opening has a reverse-tapered shape.

7. The method for manufacturing the magnetic storage device according to claim 1, wherein:
   the first insulating film comprises a lower part and an upper part whose etching properties are different from each other; and
   in the forming the opening, after the opening is formed in the upper part, an eave-like part in which the upper part projects toward a center of the opening is formed by etching the lower part in a thickness direction and in a lateral direction with the upper part serving as an etching mask.

8. A method for manufacturing a magnetic storage device comprising:
   forming lower conductive film over a substrate;
   forming a first insulating film over the lower conductive film;
   forming an opening in the first insulating film, the opening reaching the lower conductive film and the lower conductive film being exposed through the opening;
   depositing an MTJ multilayer film including a magnetization free layer, a tunnel barrier layer and a magnetization fixed layer over the lower conductive film in the opening and over the first insulating film;
   forming, by removing the MTJ multilayer film deposited over the first insulating film, an MTJ device including the MTJ multilayer film which has remained in the opening;
   removing the first insulating film, the lower conductive film being exposed in a region where the first insulating film has been removed; and
   forming, by removing the exposed lower conductive film, a lower electrode including the lower conductive film remaining under the MTJ device.

\* \* \* \* \*